US009418936B2

(12) United States Patent
Kim et al.

(10) Patent No.: US 9,418,936 B2
(45) Date of Patent: Aug. 16, 2016

(54) POWER LINE STRUCTURE FOR SEMICONDUCTOR APPARATUS (71) Applicant: SK hynix Inc., Icheon-si Gyeonggi-do (KR)

(72) Inventors: Jae Hwan Kim, Icheon-si (KR); Won John Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/070,317

(22) Filed: Mar. 15, 2016

(65) Prior Publication Data
US 2016/0197040 A1  Jul. 7, 2016

Related U.S. Application Data (62) Division of application No. 14/243,564, filed on Apr. 2, 2014, now Pat. No. 9,318,435.

(30) Foreign Application Priority Data

Jan. 27, 2014 (KR) .................. 10-2014-0009331

(51) Int. Cl.
H01L 23/528 (2006.01)
H01L 27/02 (2006.01)
H01L 27/105 (2006.01)
H01L 23/50 (2006.01)
H01L 23/00 (2006.01)

(52) U.S. Cl.
CPC ............ H01L 23/5286 (2013.01); H01L 23/50 (2013.01); H01L 24/06 (2013.01); H01L 27/0248 (2013.01); H01L 27/105 (2013.01); H01L 2924/1434 (2013.01)

(58) Field of Classification Search
CPC .................... H01L 23/5286; H01L 23/528
See application file for complete search history.

(56) References Cited

U.S. PATENT DOCUMENTS

2010/0327459 A1* 12/2010 Yasumori .............. H01L 23/522
257/776
2012/0247812 A1* 10/2012 Yasumori ............ H01L 27/0207
174/251

* cited by examiner

Primary Examiner — Mamadou Diallo
(74) Attorney, Agent, or Firm — William Park & Associates Ltd.

(57) ABSTRACT

A semiconductor apparatus has one or more semiconductor chips. The semiconductor apparatus may include a power supply pad; power lines disposed on one side of the power supply pad, and including a first power line and a second power line; and connection lines connecting the power supply pad and the power lines. The connection lines may include a plurality of first connection lines connecting the power supply pad and the first power line, and a plurality of second connection lines connecting the power supply pad and the second power line, and disposed between the first connection lines. One or more pair of adjacent first connection lines may have a connection part by which the pair of adjacent first connection lines are connected with each other.

6 Claims, 9 Drawing Sheets

POWER LINE STRUCTURE FOR SEMICONDUCTOR APPARATUS

CROSS-REFERENCES TO RELATED APPLICATION

The present application is a Division of U.S. application Ser. No. 14/243,564, filed on Apr. 2, 2014, and the present application claims priority under 35 U.S.C. §119(a) to Korean application number 10-2014-0009331, filed on Jan. 27, 2014, in the Korean Intellectual Property Office, which is incorporated herein by reference in its entirety.

TECHNICAL FIELD

Various embodiments generally relate to a semiconductor apparatus, and more particularly, to a semiconductor apparatus in which connection lines for connecting power supply pads and power lines may be improved.

BACKGROUND

Trends regarding semiconductor apparatuses continuously move toward high degrees of integration, high capacity, and high speed operation. In particular, various efforts have been made to realize a semiconductor apparatus having a high performance within a limited area.

A semiconductor apparatus includes power supply pads, power lines which are disposed on one side of the power supply pads, and connection lines which connect the power supply pads and the power lines. In order to efficiently transfer power to internal circuits, improvement of the connection lines is demanded.

SUMMARY

In an embodiment, a semiconductor apparatus having one or more semiconductor chips may include: a power supply pad; power lines disposed on one side of the power supply pad, and may include a first power line and a second power line; and connection lines connecting the power supply pad and the power lines, the connection lines including a plurality of first connection lines connecting the power supply pad and the first power line; and a plurality of second connection lines connecting the power supply pad and the second power line, and disposed between the first connection lines, wherein one or more pair of adjacent first connection lines may have a connection part by which the pair of adjacent first connection lines are connected with each other.

In an embodiment, a semiconductor apparatus may include: power supply pads including a first power supply pad which is configured to supply a first power and a second power supply pad which is configured to supply a second power; power lines disposed on one side of the power supply pads, and including a first power line and a second power line; and connection lines including a first connection line module which connects the first power supply pad and the first power line with a first connection section, and a second connection line module which connects the second power supply pad and the second power line with a second connection section, wherein the first connection line module is formed such that a width of a region which crosses with the first power line is larger than a width of a region which crosses with the second power line, and wherein the second connection line module is formed such that a width of a region which crosses with the second power line is larger than a width of a region which crosses with the first power line.

In an embodiment, a semiconductor apparatus may include: power supply pads including a first power supply pad which supplies first power and a second power supply pad which supplies second power; power lines disposed on one side of the power supply pads, and may include a first power line which supplies the first power to a first internal circuit and a second power line which supplies the second power to the first internal circuit; and connection lines including a first connection line section which connects the power supply pads and the power lines to supply power to the first internal circuit, and a second connection line section which connects the power supply pads and the power lines to supply power to a second internal circuit, the first connection line section including a first connection line module including one or more pair of first connection lines which connect the power supply pads and the first power line and are connected with each other at one ends thereof, and one or more second connection line which connects the power supply pads and the second power line and is disposed in a space defined between the one or more pair of first connection lines; and a second connection line module including one or more pair of second connection lines which connect the power supply pads and the second power line and are connected with each other at one ends thereof, and one or more first connection line which connects the power supply pads and the first power line and is disposed in a space defined between the one or more pair of second connection lines, the second connection line section including a third connection line module connecting the first power supply pad and the first power line; and a fourth connection line module connecting the second power supply pad and the second power line, wherein the third connection line module is formed such that a width of a region which crosses with the first power line is larger than a width of a region which crosses with the second power line, and wherein the fourth connection line module is formed such that a width of a region which crosses with the second power line is larger than a width of a region which crosses with the first power line.

DETAILED DESCRIPTION

Hereinafter, a semiconductor apparatus according to the present disclosure will be described below with reference to the accompanying drawings through various examples of embodiments.

Described herein are semiconductor apparatuses and according to the various embodiments may efficiently dispose connection lines for connecting power supply pads and power lines.

Figure 1:
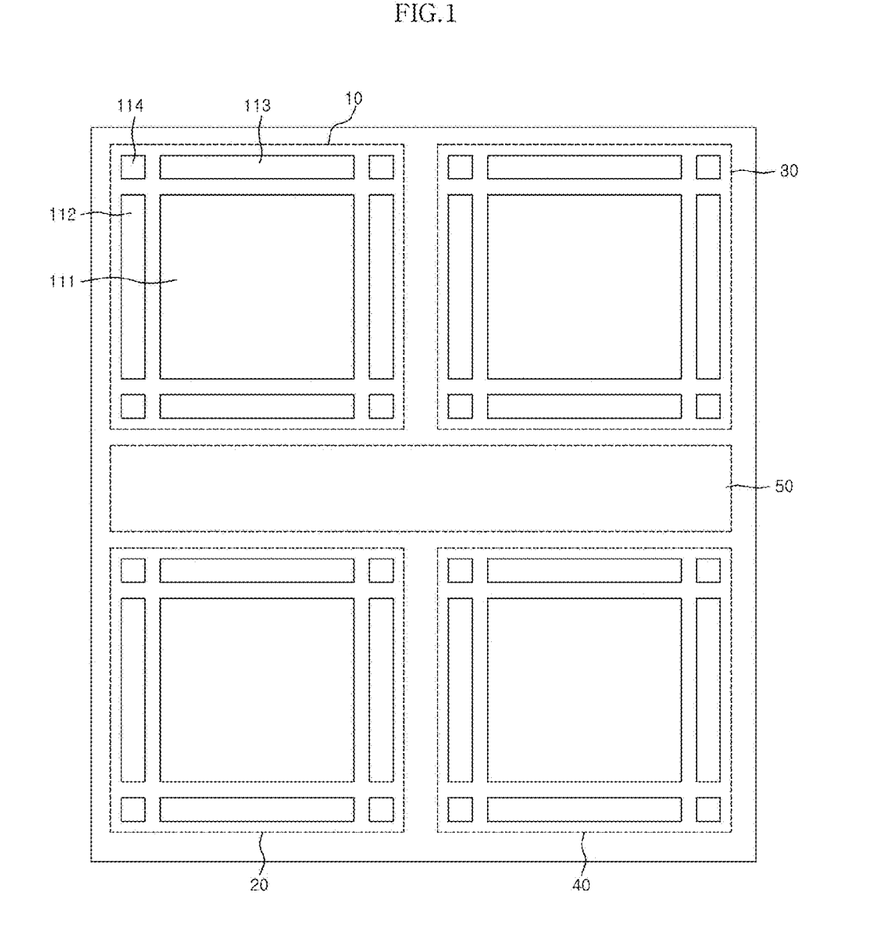
FIG. 1 is a configuration diagram of a general semiconductor apparatus.

Referring to FIG. 1, a general semiconductor apparatus may include a plurality of memory banks 10, 20, 30 and 40. The respective memory banks 10, 20, 30 and 40 are constituted by cell array regions 111 each of which may include one or more cell mats arranged in a matrix type, and driving circuit regions 112, 113 and 114 which substantially surround the cell array regions 111.

A plurality of signal lines (not shown) and a plurality of power lines (not shown) may be disposed over the respective memory banks 10, 20, 30 and 40.

The driving circuit regions 112, 113 and 114 may include sense amplifier blocks 112 which are disposed adjacent to one pair of facing edges of the cell array region 111, and sub word line driving blocks 113 which are disposed adjacent to the other pair of facing edges of the cell array region 111 in a direction substantially perpendicular to a direction in which the sense amplifier blocks 112 are disposed.

Figure 2:
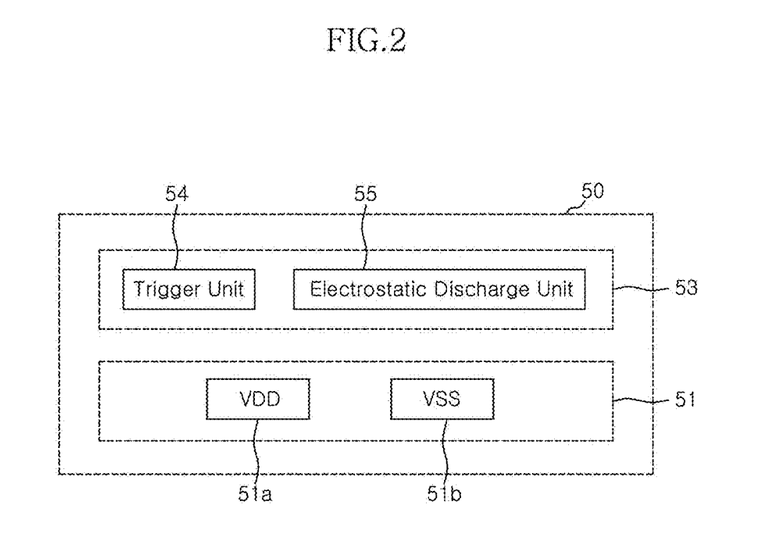
FIG. 2 is a configuration diagram of the peripheral circuit region shown in FIG. 1.

The semiconductor apparatus further may include a peripheral circuit region 50 which is laid out between the plurality of memory banks 10, 20, 30 and 40. As shown in FIG. 2, bonding pads and probing pads may be disposed in the peripheral circuit region 50. The bonding pads may include power supply pads 51.

The peripheral circuit region 50 may include an electrostatic protection circuit 53 which may protect an internal circuit from static electricity. The electrostatic protection circuit 53 may include protection elements such as a transistor, a diode and a silicon-controlled rectifier (SCR).

An example of the electrostatic protection circuit 53 will be described below.

The electrostatic protection circuit 53 may include a pair of diodes (not shown), a trigger unit 54 and an electrostatic discharge unit 55 for each input/output pad to protect an internal circuit of a semiconductor from electrostatic damage.

The disposition relationship between the power supply pads 51 of the semiconductor apparatus configured as mentioned above and lines for transferring power from the power supply pads 51 to an internal circuit will be described below.

Figure 3:
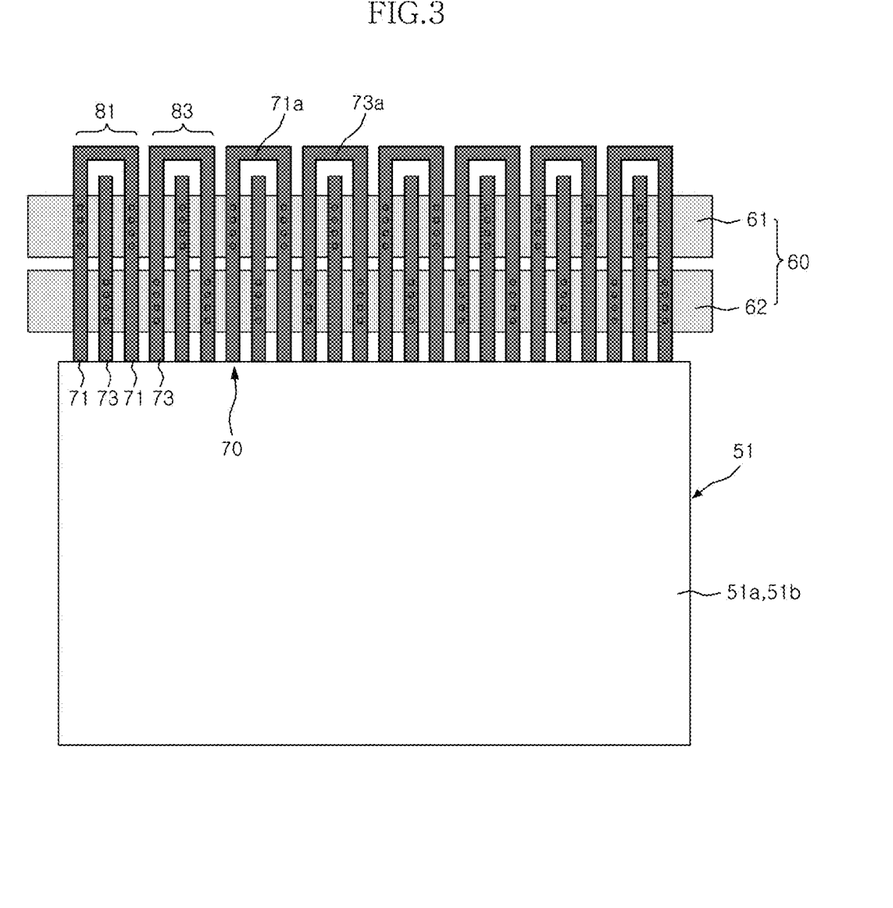
FIG. 3 is a layout diagram of a semiconductor apparatus in accordance with first embodiments.

Referring to FIG. 3, a semiconductor apparatus including one or more semiconductor chips in accordance with first embodiments may include power supply pads 51, power lines 60 which are disposed on one side of the power supply pads 51, and connection lines 70 which connect the power supply pads 51 and the power lines 60.

The power supply pads 51 (see also FIG. 2) may include a first power supply pad 51a which supplies first power, and a second power supply pad 51b which supplies second power. The first power supply pad 51a may be a power supply voltage pad which supplies a power supply voltage. The second power supply pad 51b may be a ground voltage pad which supplies a ground voltage.

The power lines 60 may include a first power line 61 which supplies the power supply voltage to an internal circuit, and a second power line 62 which supplies the ground voltage to the internal circuit. For example, the internal circuit may be the electrostatic discharge unit 55 of the electrostatic protection circuit 53.

The connection lines 70 may include first connection lines 71 which electrically connect the power supply pads 51 and the first power line 61, and second connection lines 73 which electrically connect the power supply pads 51 and the second power line 62.

In first embodiments, the first connection lines 71 and the second connection lines 73 may be alternately disposed in such a way as to be separated from each other. For example, a second connection line 73 may be disposed on one side of a first connection line 71, and another first connection line 71 may be disposed on one side of the second connection line 73.

In first embodiments, the connection lines 70 may be divided into first connection line groups 81 and second connection line groups 83. Each of the connection line groups 81 and 83 may include a plurality of unit connection lines. Each of the connection line groups 81 and 83 may be constituted by an odd-numbered unit connection lines. In the first embodiments, it will be described through various examples that each of the connection line groups 81 and 83 is constituted by three unit connection lines.

As shown in the drawing, each first connection line group 81 may include two first connection lines 71 and one second connection line 73. A connection part 71a which connects the two respective first connection lines 71 with each other may be disposed at one ends of the two first connection lines 71. The second connection line 73 may be disposed in the space defined by the two first connection lines 71 including the connection part 71a.

Each second connection line group 83 may include two second connection lines 73 and one first connection line 71. A connection part 73a which connects the two respective second connection lines 73 with each other may be disposed at one ends of the two second connection lines 73. The first connection line 71 may be disposed in the space defined by the two second connection lines 73 including the connection part 73a.

Figure 4:
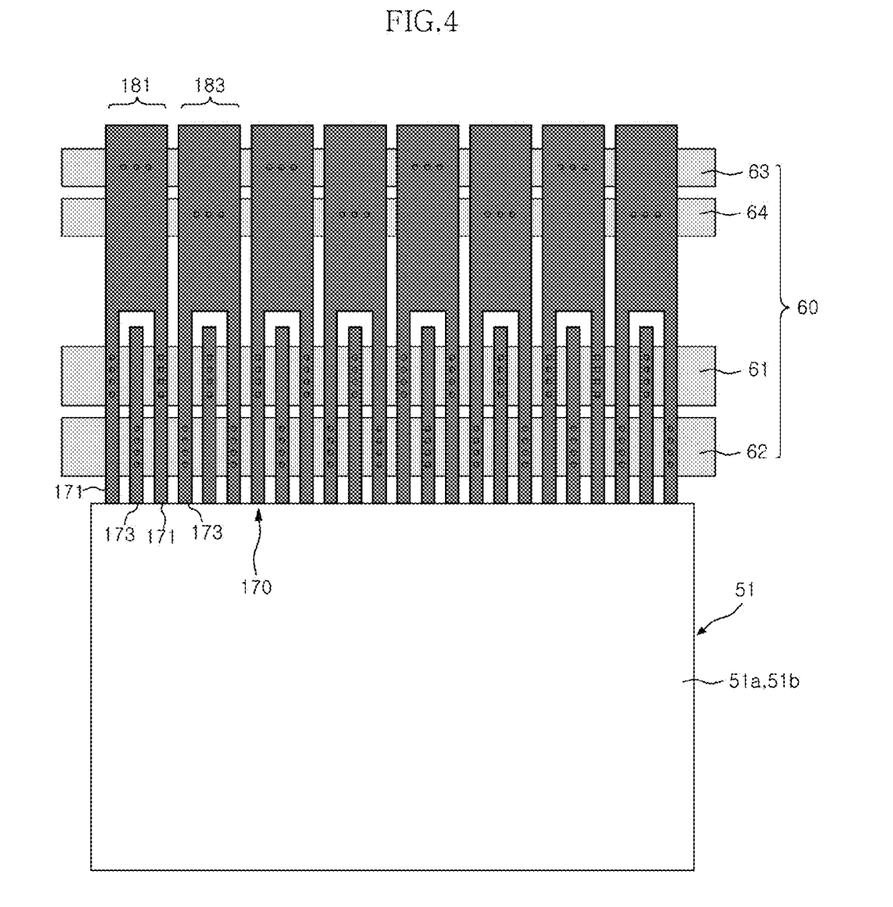
FIG. 4 is a layout diagram of a semiconductor apparatus in accordance with second embodiments.
Figure 5:
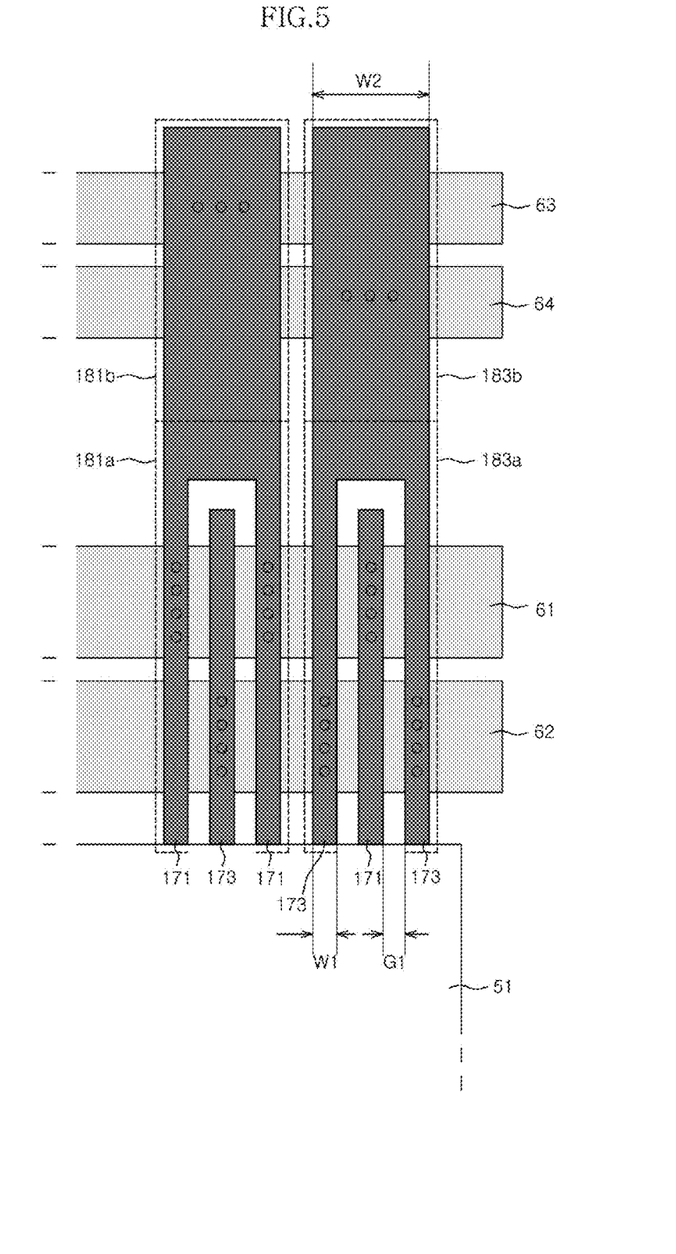
FIG. 5 is a partial enlarged diagram of FIG. 4.

A semiconductor apparatus in accordance with second embodiments will be described below with reference to FIGS. 4 and 5.

The semiconductor apparatus including one or more semiconductor chips in accordance with the second embodiments may include power supply pads 51, power lines 60 which are disposed on one side of the power supply pads 51, and connection lines 170 which connect the power supply pads 51 and the power lines 60.

The power supply pads 51 may include a first power supply pad 51a which supplies first power, and a second power supply pad 51b which supplies second power. The first power supply pad 51a may be a power supply voltage pad which supplies a power supply voltage. The second power supply pad 51b may be a ground voltage pad which supplies a ground voltage.

The power lines 60 may include a first power line 61 which supplies the power supply voltage to a first internal circuit, a second power line 62 which supplies the ground voltage to the first internal circuit, a third power line 63 which supplies the power supply voltage to a second internal circuit, and a fourth power line 64 which supplies the ground voltage to the second internal circuit. For example (see FIGS. 1 and 2), the first internal circuit may be the electrostatic discharge unit 55 of the electrostatic protection circuit 53, and the second internal circuit may be a circuit in the memory banks 10, 20, 30 and 40 which needs more power than the first internal circuit.

Similarly to the first embodiments, the connection lines 170 may include a plurality of unit connection lines 171 and 173 which are separated from each other and may be divided into first connection line groups 181 and second connection line groups 183. The first and second connection line groups 181 and 183 may be alternately disposed with each other.

Each first connection line group 181 may include a first connection line module 181a which connects the power supply pads 51 and the first and second power lines 61 and 62, and a third connection line module 181*b* which connects the power supply pads 51 and the third power line 63.

Since the first connection line module 181*a* is substantially the same as the first connection line group of the first embodiments, detailed descriptions thereof will be omitted herein.

The third connection line module 181*b* may extend from one end of the first connection line module 181*a*, and may be electrically connected with the third power line 63. That is to say, the third connection line module 181*b* has a width W2 that corresponds to the sum of widths W1 of all unit connection lines and gaps G1 between the unit connection lines.

Each second connection line group 183 may include a second connection line module 183*a* which connects the power supply pads 51 and the first and second power lines 61 and 62, and a fourth connection line module 183*b* which connects the power supply pads 51 and the fourth power line 64.

Since the second connection line module 183*a* is substantially the same as the second connection line group of the first embodiments, detailed descriptions thereof will be omitted herein.

The fourth connection line module 183*b* may extend from one end of the second connection line module 183*a*, and may be electrically connected with the fourth power line 64. The fourth connection line module 183*b* has substantially the same width as the third connection line module 181*b*.

Accordingly, in the second embodiments, it is possible to supply power to the first internal circuit through the first and second connection line modules 181*a* and 183*a*, and it is possible to supply power to the second internal circuit through the third and fourth connection line modules 181*b* and 183*b*. Due to the fact that the width of each of the third and fourth connection line modules 181*b* and 183*b* for supplying power to the power lines 63 and 64 of the second internal circuit is defined wider than the summed width of the unit connection lines of the first and second connection line modules 181*a* and 183*a* for supplying power to the power lines 61 and 62 of the first internal circuit, it is possible to supply more power to the power lines 63 and 64 of the second internal circuit.

Figure 6:
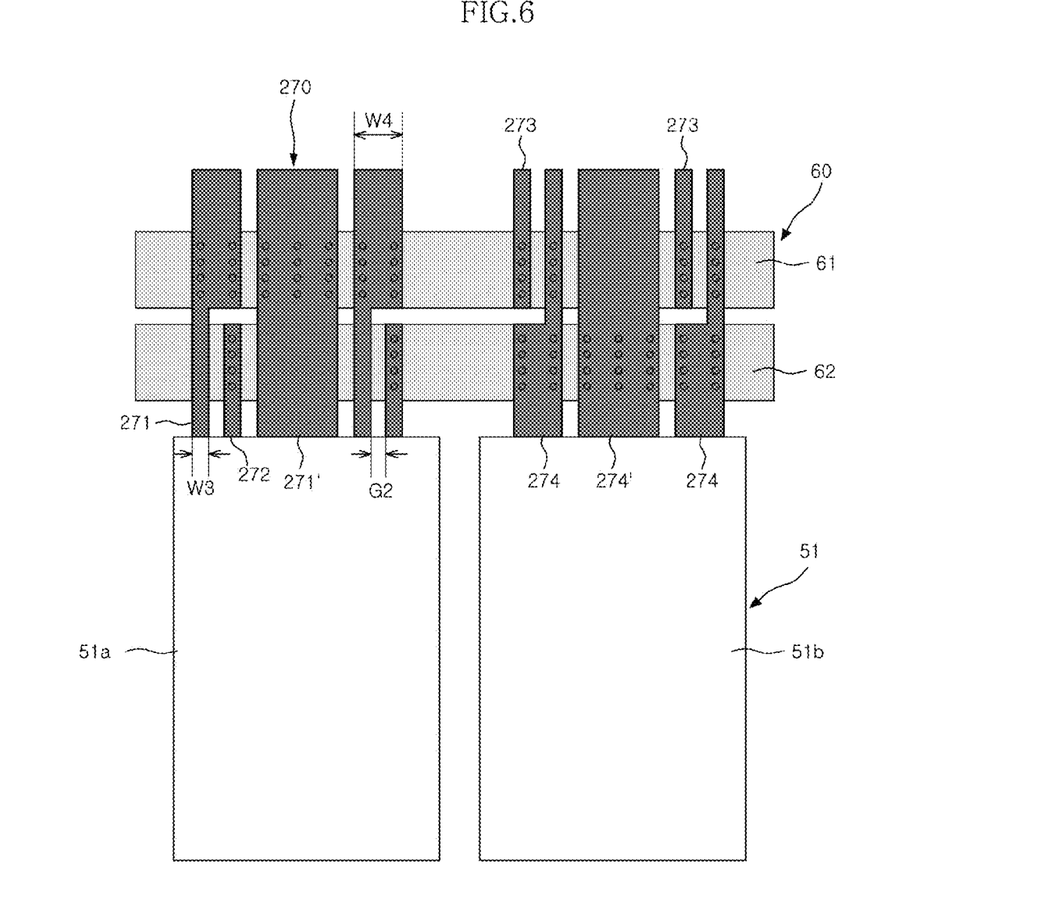
FIG. 6 is a layout diagram of a semiconductor apparatus in accordance with third embodiments.

A semiconductor apparatus in accordance with third embodiments will be described below with reference to FIG. 6.

The semiconductor apparatus including one or more semiconductor chips in accordance with the third embodiments may include power supply pads 51, power lines 60 which are disposed on one side of the power supply pads 51, and connection lines 270 which connect the power supply pads 51 and the power lines 60.

The power supply pads 51 may include a first power supply pad 51*a* which supplies a first power, and a second power supply pad 51*b* which supplies a second power. The first power supply pad 51*a* may be a power supply voltage pad which supplies a power supply voltage, and the second power supply pad 51*b* may be a ground voltage pad which supplies a ground voltage.

The power lines 60 may include a first power line 61 which supplies the power supply voltage to an internal circuit, and a second power line 62 which supplies the ground voltage to the internal circuit. For example, the internal circuit may be the trigger unit 54 of the electrostatic protection circuit 53 (i.e., see FIG. 2).

The connection lines 270 may include first connection line modules 271 which electrically connect the first power supply pad 51*a* and the first power line 61, and second connection line modules 274 which electrically connect the second power supply pad 51*b* and the second power line 62.

Each first connection line module 271 may be formed such that the width (i.e., W4) of a region which crosses with the first power line 61 is larger than the width (i.e., W3) of a region which crosses with the second power line 62. There may also be gaps G2 located between the first connection line module 271 and the first dummy connection lines 272 as shown in FIG. 6. Further, a first connection line module 271' may be formed evenly in the space between connection lines for supplying power to the general trigger unit 54. The unexplained reference numeral 272 may designate a first dummy connection line which electrically connects the first power supply pad 51*a* and the second power line 62.

Each second connection line module 274 may be formed such that the width of a region which crosses with the second power line 62 is larger than the width of a region which crosses with the first power line 61. Further, a second connection line module 274' may be formed evenly in the space between connection lines for supplying power to the general trigger unit 54. The unexplained reference numeral 273 may designate a second dummy connection line which electrically connects the second power supply pad 51*b* and the first power line 61.

Figure 7:
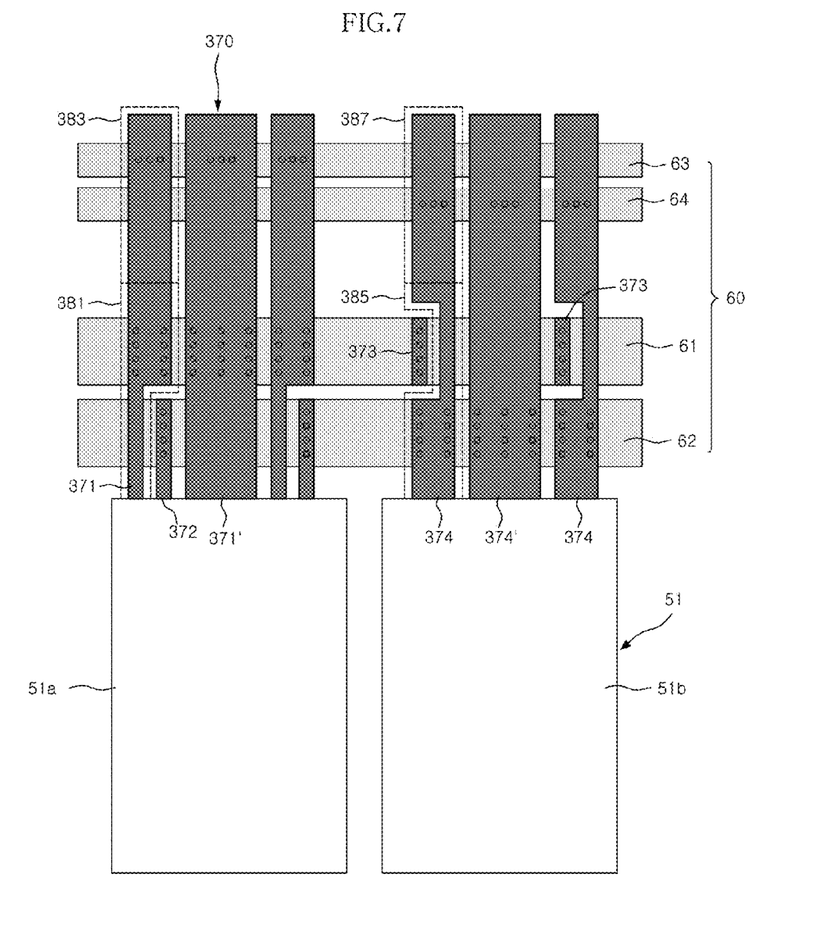
FIG. 7 is a layout diagram of a semiconductor apparatus in accordance with fourth embodiments.

A semiconductor apparatus in accordance with fourth embodiments will be described below with reference to FIG. 7.

The semiconductor apparatus including one or more semiconductor chips in accordance with the fourth embodiments may include power supply pads 51, power lines 60 which are disposed on one side of the power supply pads 51, and connection lines 370 which connect the power supply pads 51 and the power lines 60.

The power supply pads 51 may include a first power supply pad 51*a* which supplies first power, and a second power supply pad 51*b* which supplies second power. The first power supply pad 51*a* may be a power supply voltage pad which supplies a power supply voltage, and the second power supply pad 51*b* may be a ground voltage pad which supplies a ground voltage.

The power lines 60 may include a first power line 61 which supplies the power supply voltage to a first internal circuit, a second power line 62 which supplies the ground voltage to the first internal circuit, a third power line 63 which supplies the power supply voltage to a second internal circuit, and a fourth power line 64 which supplies the ground voltage to the second internal circuit. For example, the first internal circuit may be the trigger unit 54 of the electrostatic protection circuit 53, and the second internal circuit may be a circuit in the memory banks 10, 20, 30 and 40 which needs more power than the first internal circuit.

The connection lines 370 may include first connection line modules 371 and second connection line modules 374.

Each first connection line module 371 may include a first connection section 381 which electrically connects the first power supply pad 51*a* and the first power line 61, and a second connection section 383 which electrically connects the first power supply pad 51*a* and the third power line 63.

Since the first connection section 381 is substantially the same as the first connection line module 271 of the third embodiments, detailed descriptions thereof will be omitted herein. The unexplained reference numeral 372 designates a first dummy connection line which electrically connects the first power supply pad 51*a* and the second power line 62.

The second connection section 383 extends from the first connection section 381. The second connection section 383 may be electrically connected with the third power line 63.

Each second connection line module 374 may include a third connection section 385 which electrically connects the second power supply pad 51*b* and the second power line 62, and a fourth connection section 387 which electrically connects the second power supply pad 51*b* and the fourth power line 64.

Since the third connection section 385 is substantially the same as the second connection line module 273 of the third embodiments, detailed descriptions thereof will be omitted herein. The unexplained reference numeral 373 designates a second dummy connection line which electrically connects the second power supply pad 51b and the first power line 61.

The fourth connection section 387 extends from the third connection section 385. The fourth connection section 387 may be electrically connected with the fourth power line 64.

The connection lines 370 may further include first connection line modules 371' and second connection line modules 374'. The first connection line modules 371' may be formed evenly in the space between each first connection lines 371 for supplying power to the trigger unit 54 (see also FIG. 2). The second connection line module 274' may be formed evenly in the space between each second connection lines 374 for supplying power to the trigger unit 54 (see also FIG. 2).

The semiconductor apparatus having the above-described configuration may supply voltages corresponding to increased amounts of power, to the first internal circuit and the second internal circuit.

Figure 8:
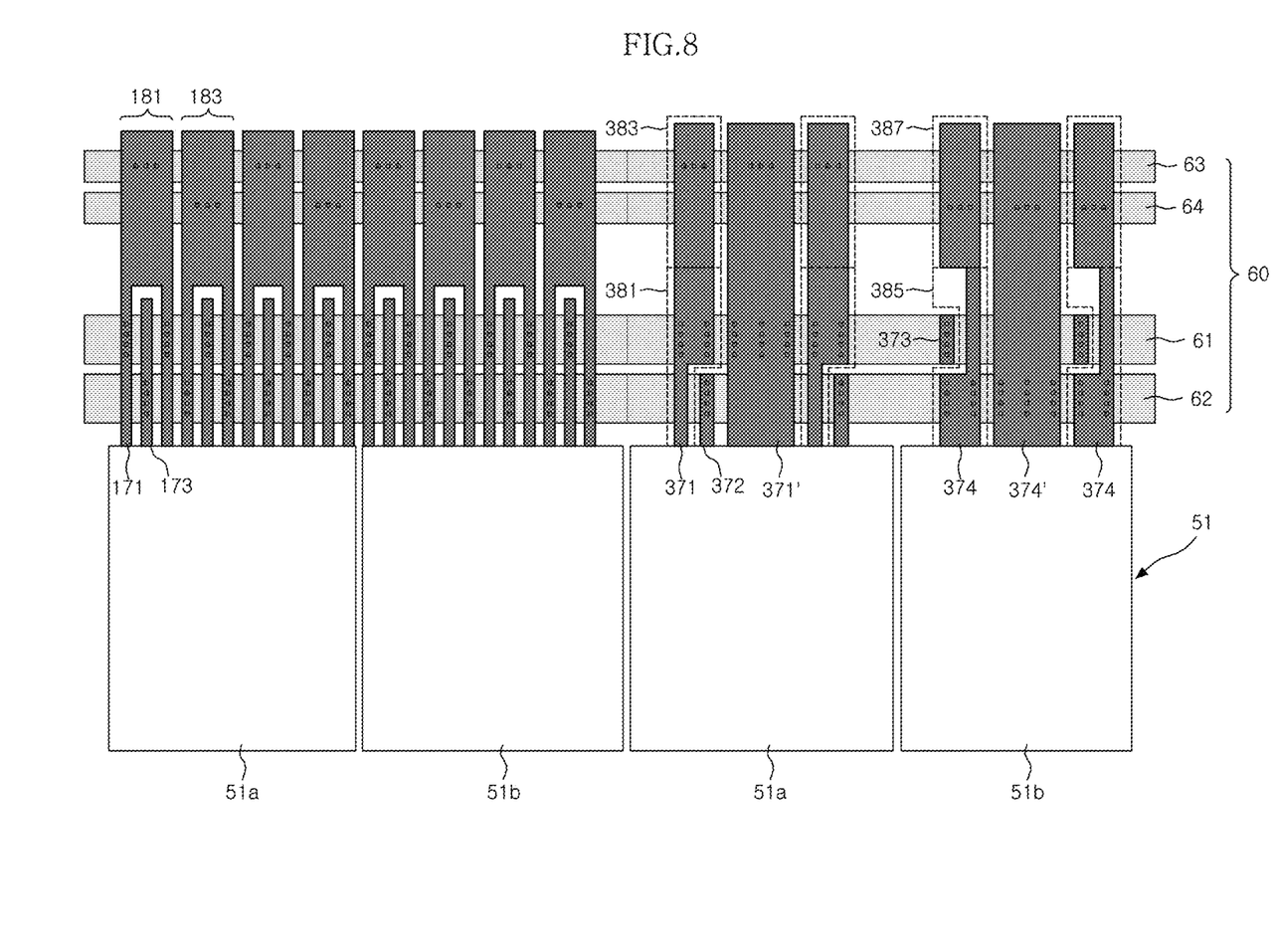
FIG. 8 is a layout diagram of a semiconductor apparatus in accordance with fifth embodiments.

A semiconductor apparatus in accordance with fifth embodiments will be described below with reference to FIG. 8.

Since the semiconductor apparatus including one or more semiconductor chips in accordance with the fifth embodiments may include both the semiconductor apparatus of the second embodiments which have an electrostatic discharge unit as an internal circuit and the semiconductor apparatus of the fourth embodiments which have a trigger unit as an internal circuit, detailed descriptions thereof will be omitted herein.

Figure 9:
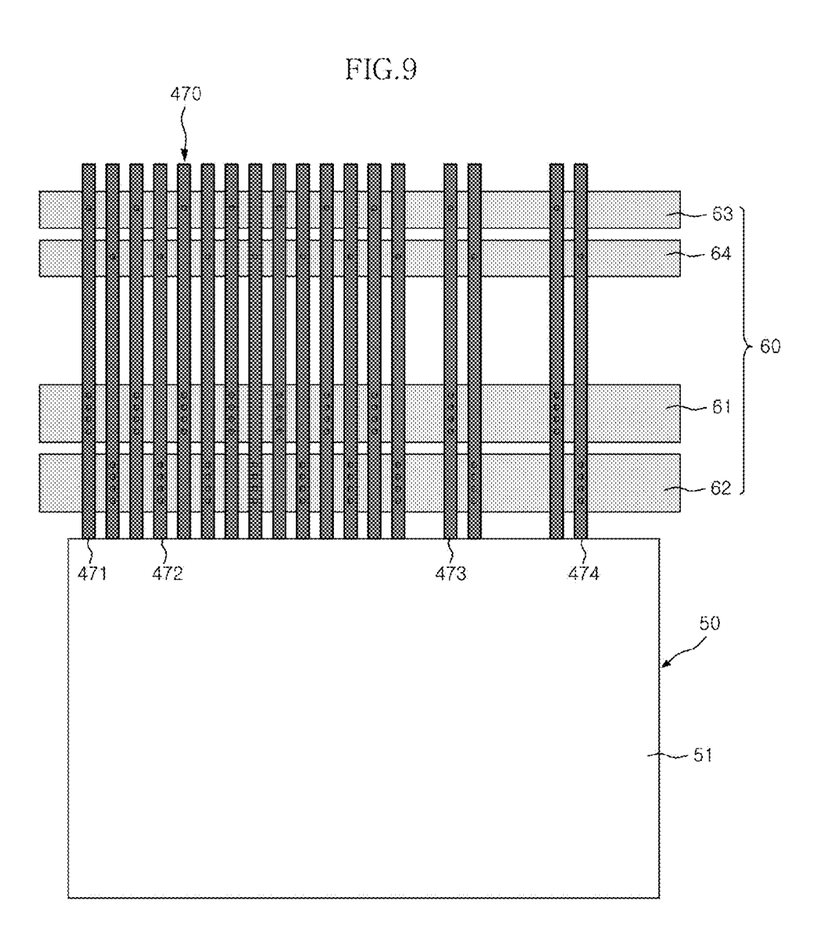
FIG. 9 is a layout diagram of a semiconductor apparatus in accordance with sixth embodiments.

A semiconductor apparatus in accordance with sixth embodiments will be described below with reference to FIG. 9.

The semiconductor apparatus including one or more semiconductor chips in accordance with the sixth embodiments may include a peripheral circuit region 50 including power supply pads 51. The semiconductor apparatus including one or more semiconductor chips in accordance with the sixth embodiments may also include power lines 60 which are disposed on one side of the power supply pads 51, and connection lines 470 which connect the power supply pads 51 and the power lines 60.

Among the component elements, as shown in the drawing, the connection lines 470 may include first connection lines 471 which are electrically connected with a first power line 61 and a third power line 63, and second connection lines 472 which are electrically connected with a second power line 62 and a fourth power line 64. The first connection lines 471 and the second connection lines 472 may be separately disposed from each other and may be alternately disposed with each other. The first and second connection lines 471 and 472 may be connection lines which are formed to supply power to an internal circuit (for example, an electrostatic discharge unit).

The connection lines 470 may further include third connection lines 473 and fourth connection lines 474. The third and fourth connection lines 473 and 474 may be connection lines which are formed to supply power to an internal circuit (for example, a trigger unit). The third connection lines 473 may be electrically connected with a first power line 61 and a third power line. The fourth connection lines 474 may be electrically connected with a second power line 62 and a fourth power line 64. A single third connection line 473 may be adjacent a single fourth connection line 474 and spaced apart from another group of connection lines which may include a single third connection line 473 adjacent a single fourth connection line 474.

have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    power supply pads including a first power supply pad which is configured to supply a first power and a second power supply pad which is configured to supply a second power;
    power lines disposed on one side of the power supply pads, and including a first power line and a second power line; and
    connection lines including a first connection line module which connects the first power supply pad and the first power line with a first connection section, and a second connection line module which connects the second power supply pad and the second power line with a second connection section,
    wherein the first connection line module is formed such that a width of a region which crosses with the first power line is larger than a width of a region which crosses with the second power line, and
    wherein the second connection line module is formed such that a width of a region which crosses with the second power line is larger than a width of a region which crosses with the first power line.

2. The semiconductor apparatus according to claim 1, wherein the connection lines further include a first dummy connection line which connects the first power supply pad and the second power line, and a second dummy connection line which connects the second power supply pad and the first power line.

3. The semiconductor apparatus according to claim 1,
    wherein the first power line is configured to supply the first power to a first internal circuit the second power line is configured to supply the second power to the first internal circuit, and
    wherein the power lines further include a third power line which is configured to supply the first power to a second internal circuit and a fourth power line which is configured to supply the second power to the second internal circuit.

4. The semiconductor apparatus according to claim 3,
    wherein the first connection line module further has a third connection section which extends from the first connection section and connects the first power supply pad and the third power line, and
    wherein the second connection line module further has a fourth connection section which extends from the second connection section and connects the second power supply pad and the fourth power line.

5. The semiconductor apparatus according to claim 3, wherein the second internal circuit is a circuit which requires more power than the first internal circuit.

6. The semiconductor apparatus according to claim 5,
    wherein the first internal circuit is a trigger unit of an electrostatic protection circuit, and
    wherein the second internal circuit is a circuit in a memory bank.

* * * * *